US012702079B2

(12) United States Patent
Chen et al.

(10) Patent No.: US 12,702,079 B2
(45) Date of Patent: Aug. 4, 2026

(54) FAN-OUT SYSTEM-LEVEL PACKAGING STRUCTURE AND PACKAGING METHOD

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, JiangSu (CN)

( * ) Notice: Subject to any disclaimer, the term of this patent is extended or adjusted under 35 U.S.C. 154(b) by 385 days.

(21) Appl. No.: 18/367,478

(22) Filed: Sep. 13, 2023

(65) Prior Publication Data

US 2024/0088000 A1     Mar. 14, 2024

(30) Foreign Application Priority Data

Sep. 14, 2022    (CN) ........................... 202211117666.6

(51) Int. Cl.
*H10W 70/05* (2026.01)
*H10W 70/60* (2026.01)
(Continued)

(52) U.S. Cl.
CPC ......... *H10W 90/701* (2026.01); *H10W 70/05* (2026.01); *H10W 70/093* (2026.01); *H10W 70/611* (2026.01); *H10W 70/65* (2026.01); *H10W 70/685* (2026.01); *H10W 90/00* (2026.01); *H10W 74/00* (2026.01); *H10W 74/15* (2026.01); *H10W 90/724* (2026.01); *H10W 90/734* (2026.01)

(58) Field of Classification Search
CPC ... H10W 70/05; H10W 70/093; H10W 70/60; H10W 70/611; H10W 70/614; H10W 70/65; H10W 70/655; H10W 70/685; H10W 72/019; H10W 72/30; H10W 72/851; H10W 74/00; H10W 74/014; H10W 74/019; H10W 74/111; H10W 90/00; H10W 90/288; H10W 90/401; H10W 90/701; H10W 90/724; H10W 90/734; H10W 95/00; G03F 7/70541; H10P 72/74; H10P 72/7424; H10P 72/743
See application file for complete search history.

(56) References Cited

U.S. PATENT DOCUMENTS

2024/0063098 A1* 2/2024 Liu ........................ H10W 90/00
2024/0120305 A1* 4/2024 Ecton .................. H10W 70/685

* cited by examiner

*Primary Examiner* — Hoai V Pham
(74) *Attorney, Agent, or Firm* — IPRTOP LLC

(57) ABSTRACT

A method of fabricating a fan-out system-level package and structure are disclosed. The method comprises: forming a first rewiring layer over a supporting substrate; electrically connecting a connecting bridge to the first rewiring layer; forming an encapsulation layer over the first rewiring layer and the connecting bridge; forming a second rewiring layer over the encapsulation layer, and electrically connected to the connecting bridge; removing the supporting substrate, and disposing conductive blocks on a side of the first rewiring layer facing away from the encapsulation layer; electrically connecting first function chips and components to a side of the second rewiring layer facing away from the encapsulation layer; forming a cooling cover over the second rewiring layer, leaving a cavity between the cooling cover and the second rewiring layer to house the first function chips and the components; and connecting the conductive blocks to a packaging wafer.

6 Claims, 6 Drawing Sheets

(51) Int. Cl.
H10W 70/65 (2026.01)
H10W 70/685 (2026.01)
H10W 90/00 (2026.01)
H10W 74/00 (2026.01)
H10W 74/15 (2026.01)

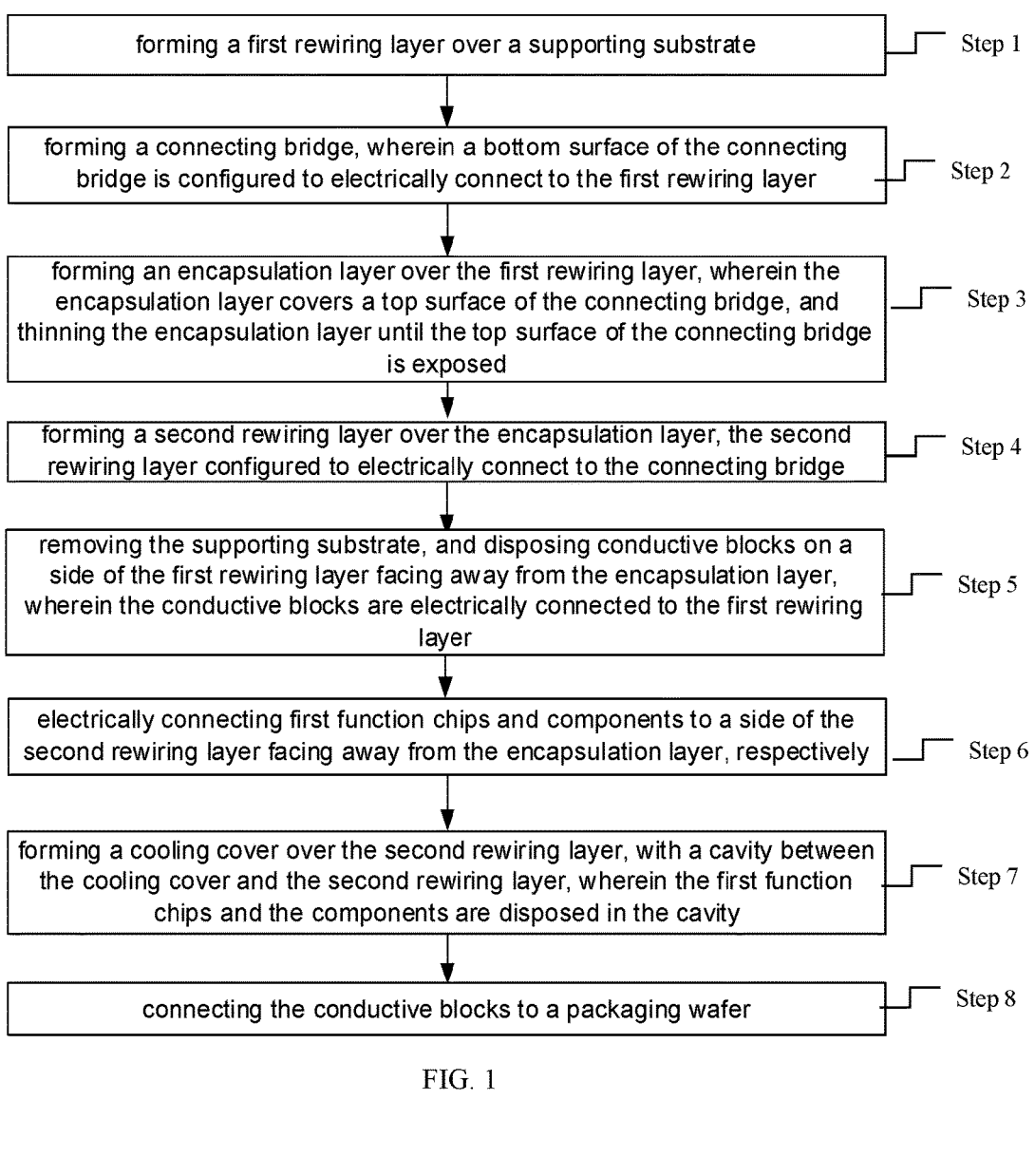

| | |
|---|---|
| forming a first rewiring layer over a supporting substrate | Step 1 |
| forming a connecting bridge, wherein a bottom surface of the connecting bridge is configured to electrically connect to the first rewiring layer | Step 2 |
| forming an encapsulation layer over the first rewiring layer, wherein the encapsulation layer covers a top surface of the connecting bridge, and thinning the encapsulation layer until the top surface of the connecting bridge is exposed | Step 3 |
| forming a second rewiring layer over the encapsulation layer, the second rewiring layer configured to electrically connect to the connecting bridge | Step 4 |
| removing the supporting substrate, and disposing conductive blocks on a side of the first rewiring layer facing away from the encapsulation layer, wherein the conductive blocks are electrically connected to the first rewiring layer | Step 5 |
| electrically connecting first function chips and components to a side of the second rewiring layer facing away from the encapsulation layer, respectively | Step 6 |
| forming a cooling cover over the second rewiring layer, with a cavity between the cooling cover and the second rewiring layer, wherein the first function chips and the components are disposed in the cavity | Step 7 |
| connecting the conductive blocks to a packaging wafer | Step 8 |

FAN-OUT SYSTEM-LEVEL PACKAGING STRUCTURE AND PACKAGING METHOD

CROSS REFERENCE TO RELATED APPLICATION

The present application claims the benefit of priority to Chinese Patent Application No. CN 202211117666.6, entitled "FAN-OUT SYSTEM-LEVEL PACKAGING STRUCTURE AND PACKAGING METHOD", filed with CNIPA on Sep. 14, 2022, the disclosure of which is incorporated herein by reference in its entirety for all purposes.

FIELD OF THE INVENTION

The present disclosure generally relates to semiconductor packaging and in particular relates to a fan-out system-level packaging structure and packaging method.

BACKGROUND OF THE INVENTION

As technology advances, the electronics industry trends towards smaller and more versatile devices. This has led to the development of advanced packaging technologies such as chip-scale packaging (CSP), wafer-level packaging (WLP), and system-level packaging (SIP). System-level packaging, an emerging heterogeneous integration technology, is becoming increasingly popular. It integrates multiple functional chips and components into a single package, providing a complete system with a short development cycle, multiple functions, low power consumption, excellent performance, small size, and light weight.

The rapid growth of the semiconductor industry has pushed chip technology to the nanoscale. As semiconductor products become smaller and more densely packed, there are more demanding requirements for circuit density and accuracy in packaging. However, current system-level packaging still has limitations such as poor integration, compatibility issues, and limited integration capabilities. This makes it difficult to meet the needs of ultra-high-density packaging.

To address this challenge, there is a need for a new fan-out system-level packaging structure and packaging method.

SUMMARY

The present disclosure provides a method of fabricating a fan-out system-level package, comprising steps of: step 1: forming a first rewiring layer over a supporting substrate; step 2: forming a connecting bridge, wherein a bottom surface of the connecting bridge is configured to electrically connect to the first rewiring layer; step 3: forming an encapsulation layer over the first rewiring layer, wherein the encapsulation layer covers a top surface of the connecting bridge, and thinning the encapsulation layer until the top surface of the connecting bridge is exposed; step 4: forming a second rewiring layer over the encapsulation layer, wherein the second rewiring layer is configured to electrically connect to the connecting bridge; step 5: removing the supporting substrate, and disposing conductive blocks on a side of the first rewiring layer facing away from the encapsulation layer, wherein the conductive blocks are electrically connected to the first rewiring layer; step 6: electrically connecting first function chips and components to a side of the second rewiring layer facing away from the encapsulation layer, respectively; step 7: forming a cooling cover over the second rewiring layer, wherein a cavity is configured to be between the cooling cover and the second rewiring layer, wherein the first function chips and the components are disposed in the cavity; and step 8: connecting the conductive blocks to a packaging wafer.

The present disclosure further provides a fan-out system-level packaging structure, comprising: a first rewiring layer; a second rewiring layer, formed above the first rewiring layer; an intermediate structure, disposed between the first rewiring layer and the second rewiring layer, wherein intermediate structure comprises a connecting bridge and an encapsulation layer, wherein the connecting bridge is embedded in the encapsulation layer in a vertical direction, wherein a bottom end of the connecting bridge is electrically connected to the first rewiring layer and a top end of the connecting bridge is electrically connected to the second rewiring layer; conductive blocks, located on a side of the first rewiring layer facing away from the encapsulation layer, and electrically connected to the first rewiring layer; first function chips, located on a side of the second rewiring layer facing away from the encapsulation layer, and electrically connected to the second rewiring layer; components, disposed on the side of the second rewiring layer facing away from the encapsulation layer, and electrically connected to the second rewiring layer, wherein the first function chips are spaced apart from the components; a cooling cover, disposed on the side of the second rewiring layer facing away from the encapsulation layer, with a cavity formed between the cooling cover and the second rewiring layer, wherein the first function chips and the components are disposed in the cavity; and a packaging wafer, wherein the packaging wafer and the conductive blocks are located on the same side of the first rewiring layer, wherein the packaging wafer is connected to the conductive blocks.

In the fan-out system-level packaging structure and method of the present disclosure, the connecting bridge is used to achieve interconnection between upper and lower layers, increasing the density of I/O lines. High-density connection packaging is achieved by connecting the first functional chips and the components on the second rewiring layer. This allows for the integration of functional chips such as processors and memory, as well as optoelectronic components, optical components, and MEMS components into a single package on a packaging wafer (e.g., 8-inch or 12-inch) to achieve a complete system. This improves the integration of the process/structure. Additionally, by connecting the second functional chips and the connector through the conductive blocks, greater flexibility, and wider compatibility as well as high-density connections can be obtained, which enhances the overall performance of the package.

BRIEF DESCRIPTION OF THE DRAWINGS

FIG. 1 shows a flowchart of a fan-out system-level packaging method of the present disclosure.

FIG. 2 shows a schematic diagram of an intermediate structure obtained after forming a release layer over a supporting substrate according to an embodiment of the present disclosure.

REFERENCE NUMERALS

Figure 3:
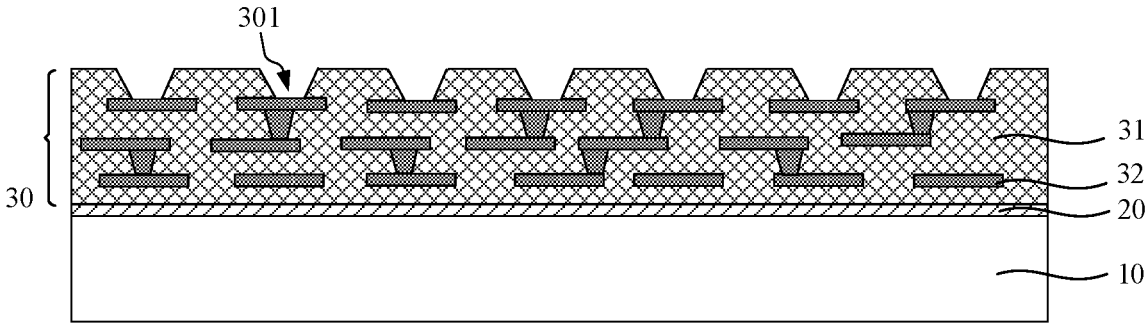
FIG. 3 shows a schematic diagram of an intermediate structure obtained after forming a first rewiring layer over the release layer and forming first openings on a side of the first rewiring layer facing away from the supporting substrate according to an embodiment of the present disclosure.

10 Supporting Substrate
20 Release Layer
30 First Rewiring Layer
31 First Dielectric Layer
32 First Metal Wiring Layer
301 First Openings
302 Second Openings
40 Conductive Posts
50 Conductive Plugs
60 Connecting Bridge
70 Encapsulation Layer
80 Second Rewiring Layer
81 Second Dielectric Layer
82 Second Metal Wiring Layer
90 Conductive Blocks
100 First Function Chips
101 Chip Pads
110 Components
120 First Filler Layer

130 Heat-Transfer-Medium Layer
140 Cooling Cover
150 Second Function Chips
160 Connector
170 Second Filler Layer

DETAILED DESCRIPTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIGS. 1-15. It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

Embodiment 1

Embodiment 1 provides a method of fabricating a fan-out system-level packaging. FIG. 1 illustrates a flowchart of the method. The method comprises the following steps:

1) forming a first rewiring layer over a supporting substrate;

2) providing a connecting bridge, and electrically connecting the connecting bridge to the first rewiring layer;

3) forming an encapsulation layer over the first rewiring layer, wherein the encapsulation layer covers a top surface of the connecting bridge, and thinning the encapsulation layer until the top surface of the connecting bridge is exposed;

4) forming a second rewiring layer over the encapsulation layer, and electrically connected to the connecting bridge;

5) removing the supporting substrate, and disposing conductive blocks on a side of the first rewiring layer facing away from the encapsulation layer, wherein the conductive blocks are electrically connected to the first rewiring layer;

6) electrically connecting first function chips and components to a side of the second rewiring layer facing away from the encapsulation layer, respectively;

7) forming a cooling cover over the second rewiring layer, with a cavity formed between the cooling cover and the second rewiring layer, wherein the first function chips and the components are disposed in the cavity; and 8) connecting the conductive blocks to a packaging wafer.

Referring to FIGS. 2 to 3, step 1) comprises: forming the first rewiring layer 30 over the supporting substrate 10.

As an example, as shown in FIG. 2, the supporting substrate 10 is one of a glass substrate, a metal substrate, a semiconductor substrate, a polymer substrate, and a ceramic substrate; the supporting substrate 10 is for preventing cracking, warping, fracturing, etc. of structures formed above it during the packaging process; and the supporting substrate 10 may be wafer-like, panel-like, or of any other desired shape.

As an example, in order to facilitate the subsequent removing of the supporting substrate 10, a release layer 20 is disposed on the supporting substrate 10; the release layer 20 is made of tape or polymer, which is coated on a surface of the supporting substrate 10 by a spin-coating process, and then cured by UV curing or heat curing.

As an example, as shown in FIG. 3, the first rewiring layer 30 is formed on the release layer 20; the first rewiring layer 30 comprises a first dielectric layer 31 and a first metal wiring layer 32 stacked in a vertical direction. Forming the first rewiring layer 30 comprises:

> (1) forming the first dielectric layer 31 on a surface of the release layer 20 by chemical vapor deposition, physical vapor deposition, or other suitable methods, wherein the first dielectric layer 31 is made of one or more of epoxy resin, silicone, polyimide, Polybenzoxazole, Benzocyclobutene, silicon oxide, phosphor-silicon glass, and fluorine-containing glass;
>
> (2) forming a first metal layer on a surface of the first dielectric layer 31 using sputtering, electroplating, chemical plating, or other suitable methods, and patterning the first metal layer by etching to form the first metal wiring layer 32. The first metal wiring layer 32 is made of one or more of copper, aluminum, nickel, gold, silver, and titanium.

The above steps may be repeated as necessary to form a first rewiring layer 30 having a multilayered structure for different wiring needs, wherein different layers of the multilayered structure are electrically connected to each other by conductive plugs.

As an example, first openings 301 are formed on a side of the first rewiring layer 30 facing away from the release layer 20 to partially expose the first metal wiring layer 32; the first opening 301 may be formed by photolithographic etching, laser drilling, or other suitable methods.

Figure 4:
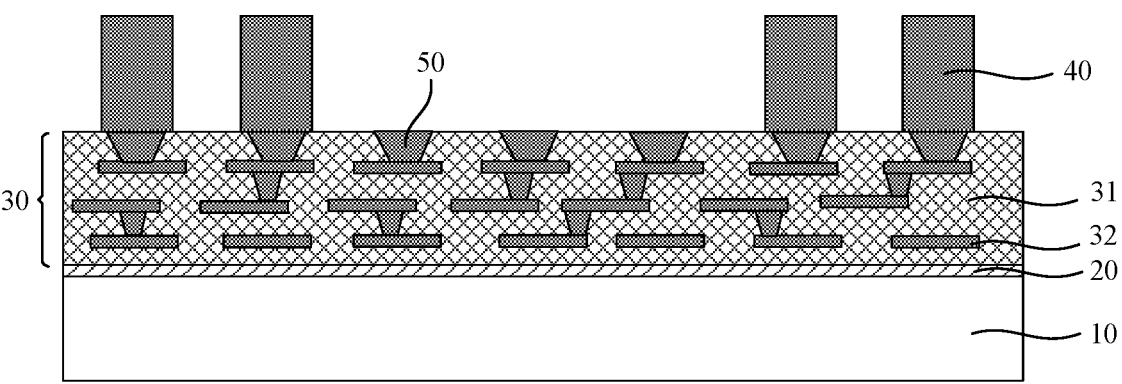
FIG. 4 shows a schematic diagram of an intermediate structure obtained after forming conductive posts over the first rewiring layer according to an embodiment of the present disclosure.
Figure 5:
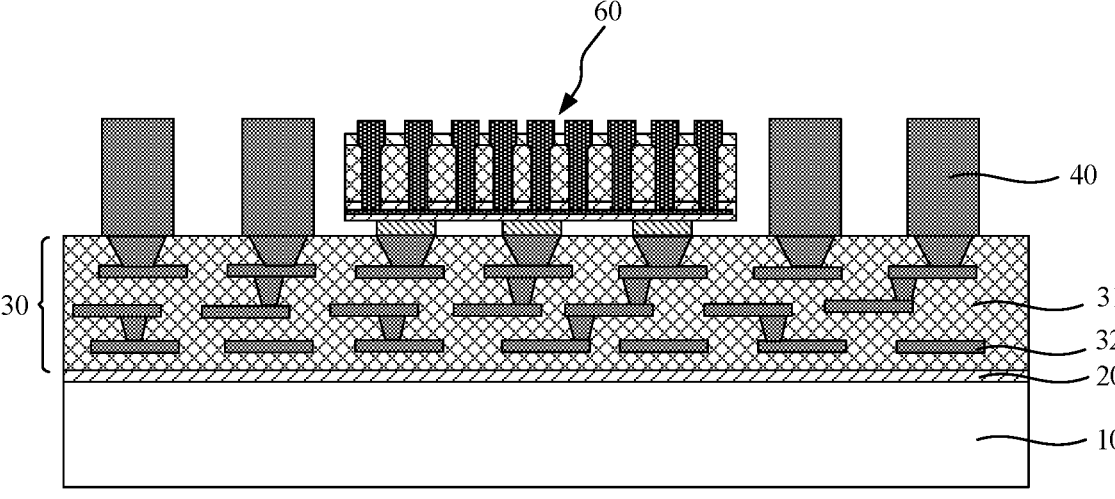
FIG. 5 shows a schematic diagram of an intermediate structure obtained after connecting a connecting bridge to the first rewiring layer according to an embodiment of the present disclosure.

Referring to FIGS. 4 to 5, step 2) comprises: electrically connecting the connecting bridge 60 to the first rewiring layer 30.

As an example, as shown in FIG. 5, the connecting bridge 60 is an inorganic perforated bridge for connecting chips, formed by filling through-silicon-vias (TSV) with conductive metal materials, with a line width/line spacing as low as 0.2 μm/0.2 μm, increasing the density of I/O lines, and achieving high-density chip connection.

Optionally, the connecting bridge 60 is an organic perforated structure for connecting chips, formed by first etching through-holes in an organic layer and filling the through-holes with conductive metal materials, with a line width/line spacing as narrow as 22 μm/22 μm; although the line width/line spacing of the organic perforated bridge may be larger than that of the inorganic perforated bridge, the former is much cheaper; therefore, in actual production and manufacturing, the type of connecting bridge 60 may be chosen based on factors such as demand and production cost.

As an example, as shown in FIG. 4, prior to performing step 2), conductive posts 40 are formed at predetermined locations of the first rewiring layer 30, conductive plugs 50 are formed at locations over which the connecting bridge 60 is subsequently disposed, and the connecting bridge 60 is electrically connected to the first rewiring layer 30 via the conductive plugs 50; connecting bridges are more costly, and in order to reduce costs, the connecting bridge 60 is used for connection in areas where the package body requires ultra-high density connection, and the conductive posts 40 are used for connection in other areas.

As an example, the conductive posts 40 are copper posts.

Figure 6:
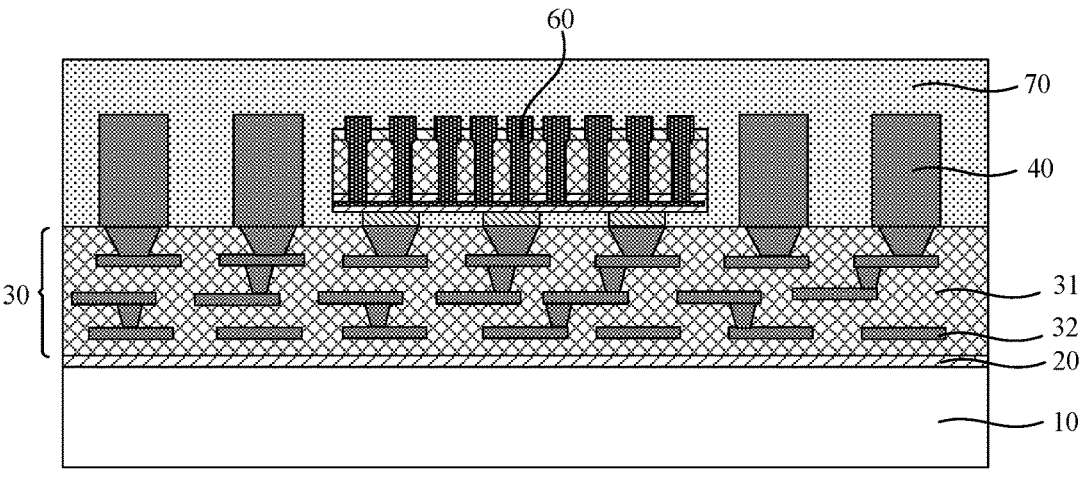
FIG. 6 shows a schematic diagram of an intermediate structure obtained after forming an encapsulation layer over the first rewiring layer according to an embodiment of the present disclosure.
Figure 7:
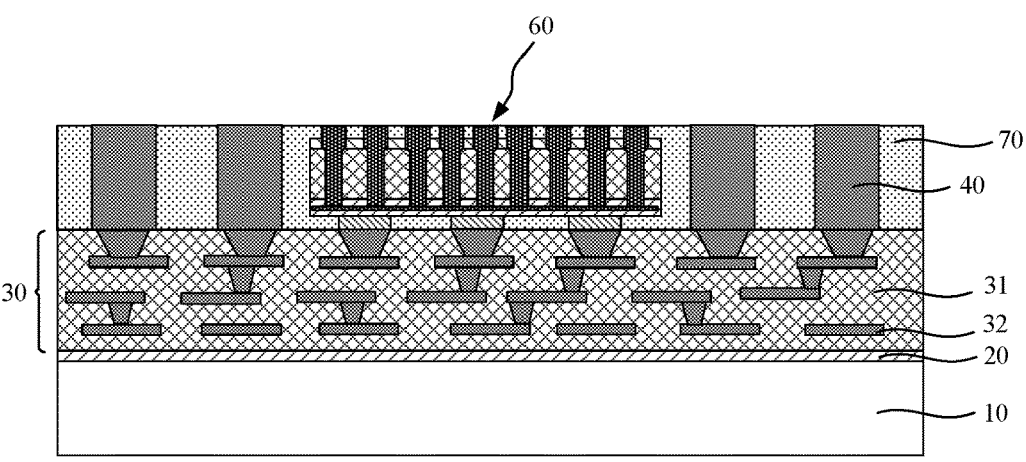
FIG. 7 shows a schematic diagram of an intermediate structure obtained after thinning the encapsulation layer according to an embodiment of the present disclosure.

Referring to FIGS. 6 to 7, step 3) comprises: forming the encapsulation layer 70 over the first rewiring layer 30, wherein the encapsulation layer 70 covers a top surface of the connecting bridge 60, and thinning the encapsulation layer 70 until the top surface of the connecting bridge 60 is exposed;

As an example, as shown in FIG. 6, the encapsulation layer 70 also covers the conductive posts 40. Techniques of forming the encapsulation layer 70 comprise, but not limited to, compression molding, transfer molding, liquid seal molding, vacuum lamination, and spin coating; the encapsulation layer 70 is made of curable materials, such as polymer-based materials, resin-based materials, polyamide, or any combination thereof.

As an example, as shown in FIG. 7, the encapsulation layer 70, after thinning, exposes the top surfaces of the connecting bridge 60 and the conductive posts 40, and methods for thinning the encapsulation layer 70 comprise grinding, polishing, or other suitable methods.

Figure 8:
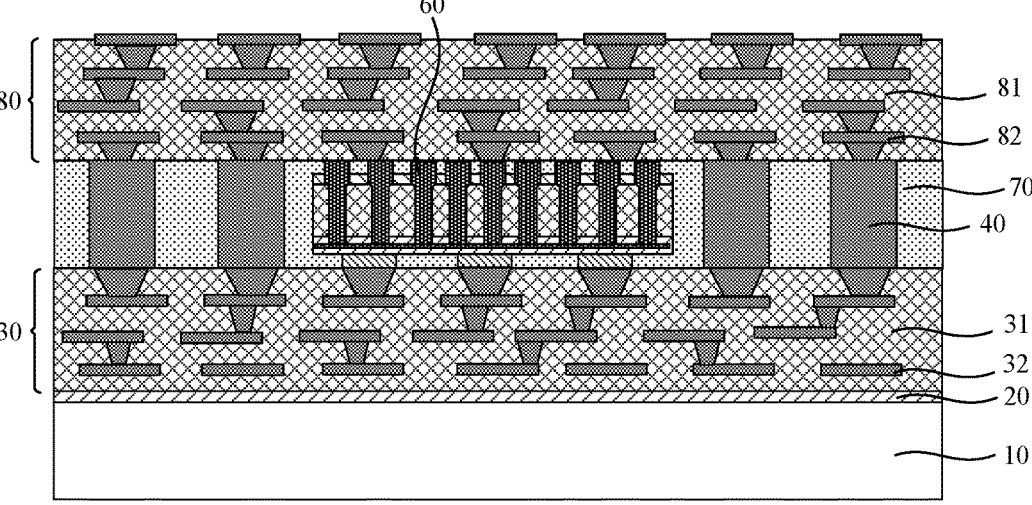
FIG. 8 shows a schematic diagram of an intermediate structure obtained after forming a second rewiring layer over the encapsulation layer according to an embodiment of the present disclosure.

Referring to FIG. 8, step 4) comprises: forming the second rewiring layer 80 over the encapsulation layer 70, wherein the second rewiring layer 80 is electrically connected to the connecting bridge 60.

As an example, the second rewiring layer 80 is electrically connected to the conductive posts 40 and the connecting bridge 60, the second rewiring layer 80 comprises a second dielectric layer 81 and a second metal wiring layer 82 vertically stacked together, and forming the second rewiring layer 80 is similar to forming the first rewiring layer 30.

Figure 9:
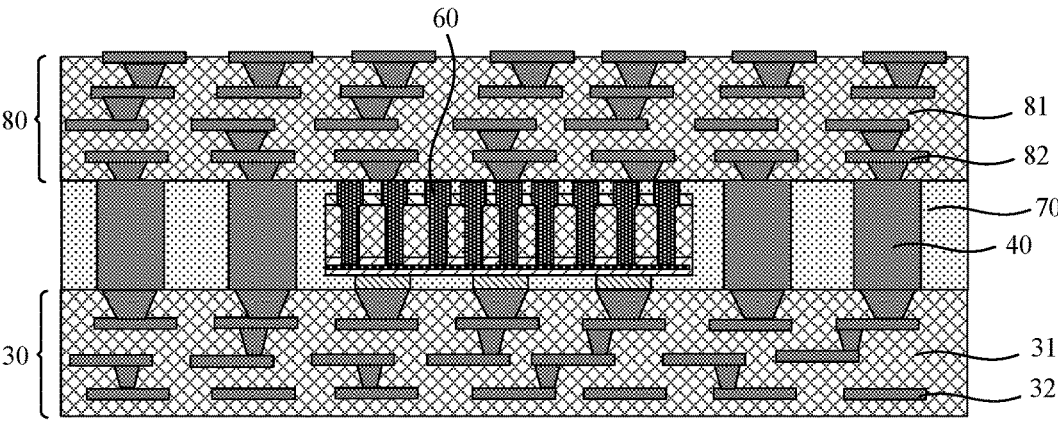
FIG. 9 shows a schematic diagram of an intermediate structure obtained after removing the supporting substrate according to an embodiment of the present disclosure.
Figure 10:
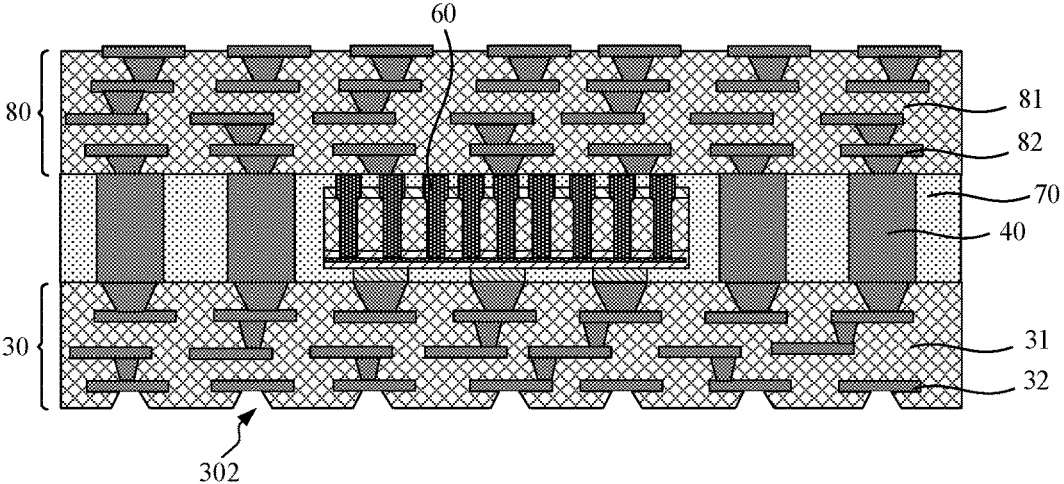
FIG. 10 shows a schematic diagram of an intermediate structure obtained after forming second openings on a side of the first rewiring layer facing away from the encapsulation layer according to an embodiment of the present disclosure.
Figure 11:
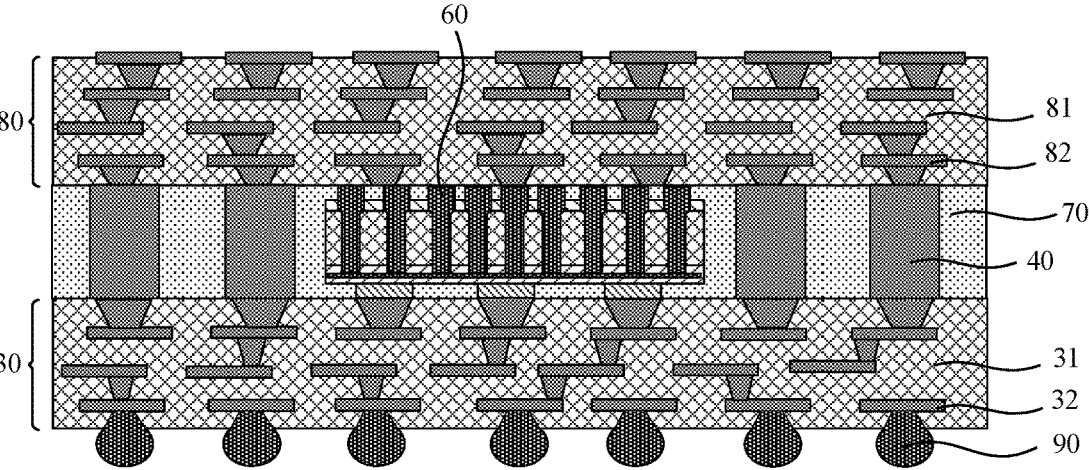
FIG. 11 shows a schematic diagram of an intermediate structure obtained after forming conductive blocks on a side of the first rewiring layer facing away from the encapsulation layer according to an embodiment of the present disclosure.

Referring to FIGS. 9 to 11, step 5) comprises: removing the supporting substrate 10 and disposing conductive blocks 90 on a side of the first rewiring layer 30 facing away from the encapsulation layer 70, wherein the conductive blocks 90 are electrically connected to the first rewiring layer 30.

As an example, as shown in FIG. 9, the supporting substrate 10 is removed by removing the release layer 20; specifically, a corresponding technique is chosen based on the type of the release layer 20 to make the release layer 20 less adhesive, and thus peel off the supporting substrate 10 along with the release layer 20. For example, when the release layer 20 is made of a photo or thermal conversion material, a laser or UV light may be used to irradiate the photo conversion layer or heat may be applied to the thermal conversion layer, to separate the photo or thermal conversion layer from the first rewiring layer 30 and the supporting substrate 10.

As an example, as shown in FIG. 10, second openings 302 are formed on a side of the first rewiring layer 30 facing away from the release layer 70 to partially expose the first metal wiring layer 32; the second opening 302 may be formed by photolithographic etching, laser drilling, or other suitable methods.

As an example, the conductive blocks 90 extend into the second openings 302 to be electrically connected to the first rewiring layer 30, as shown in FIG. 11.

As an example, the conductive blocks 90 comprise solder balls or conductive inserts.

Figures 12, 13:
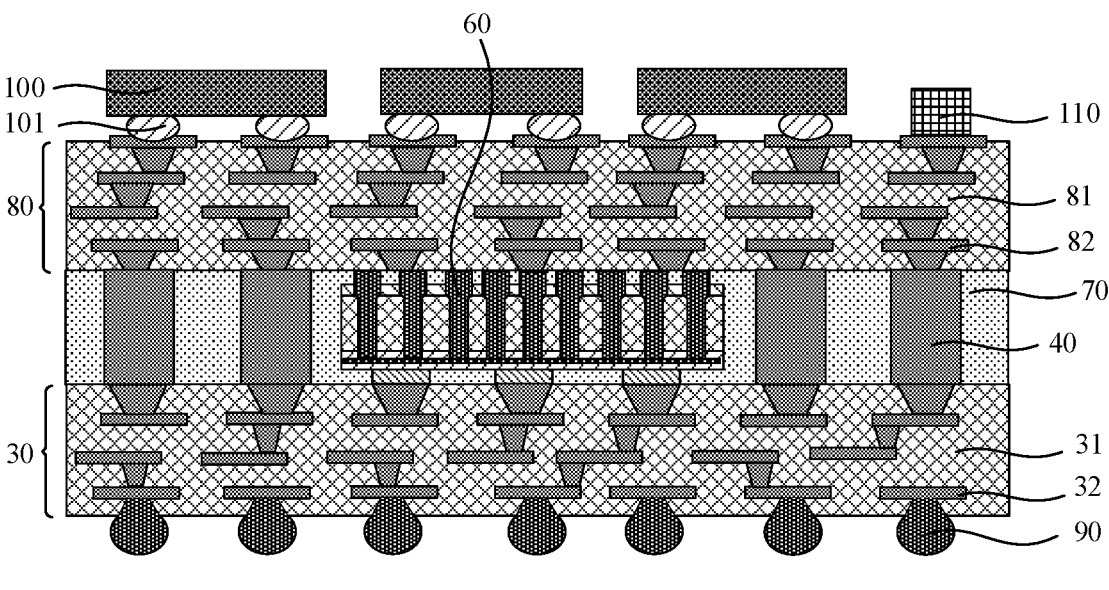
FIG. 12 shows a schematic diagram of an intermediate structure obtained after connecting the first functional chips and components to the second rewiring layer facing away from the encapsulation layer according to an embodiment of the present disclosure.
FIG. 13 shows a schematic diagram of an intermediate structure obtained after forming a cooling cover over the second rewiring layer facing away from the encapsulation layer according to an embodiment of the present disclosure.

Referring to FIG. 12, step 6) comprises: electrically connecting first function chips 100 and components 110 to a side of the second rewiring layer 80 facing away from the encapsulation layer 70.

As an example, there are multiple first functional chips 100, such as processors and memory. Similarly, there may be multiple components 110, including photoelectric components, optical components, and/or MEMS components. It should be noted that the present disclosure only exemplarily enumerates several types of the first function chips 100 and the components 110, and in the actual production and manufacturing, the types, and numbers of the first function chips 100 and the components 110 may be determined according to the functional requirements of the packaging.

Specifically, the first function chips 100 are electrically connected to the second rewiring layer 80 via chip pads (chip pins) 101, and the components 110 are connected to the second rewiring layer 80 via Surface Mounted Technology (SMT).

Referring to FIG. 13, step 7) comprises: forming a cooling cover 140 over the second rewiring layer 80, with a cavity formed between the cooling cover 140 and the second rewiring layer 80, wherein the first function chips 100 and the components 110 are disposed in the cavity.

As an example, before forming the cooling cover 140, the method further comprises: forming a first filler layer 120 at gaps between the first function chips 100 and the second rewiring layer 80 using dispensing or other suitable process; the first filler layer 120 protects the connection between the first function chips 100 and the second rewiring layer 80 from corrosion or physical damage, and also improves the bonding strength between the first function chips 100 and the second rewiring layer 80, thereby improving mechanical strength of the package.

As an example, the cooling cover 140 is made of one of silver, copper, gold, aluminum, and other suitable materials with a high thermal conductivity.

As an example, a heat-transfer-medium layer 130 is formed between surfaces of the first function chips 100 and the cooling cover 140; the heat-transfer-medium layer 130 may be made of thermal paste or other suitable materials with a high thermal conductivity; the heat-transfer-medium layer 130 not only acts as a binder between the first function chips 100 and the cooling cover 140, but also dissipates heat generated by the first function chips 100.

Next, step 8) comprises: connecting the conductive blocks 90 to the packaging wafer.

As an example, the packaging wafer is an 8-inch or 12-inch wafer; the conductive blocks 90 are connected to the packaging wafer for subsequent electrical lead-out of the packing structure, such as connecting to an external power supply, etc.

As an example, when the conductive blocks 90 are directly connected to the packaging wafer, the conductive blocks 90 are preferentially soldered to the packaging wafer by means of solder balls.

Figure 14:
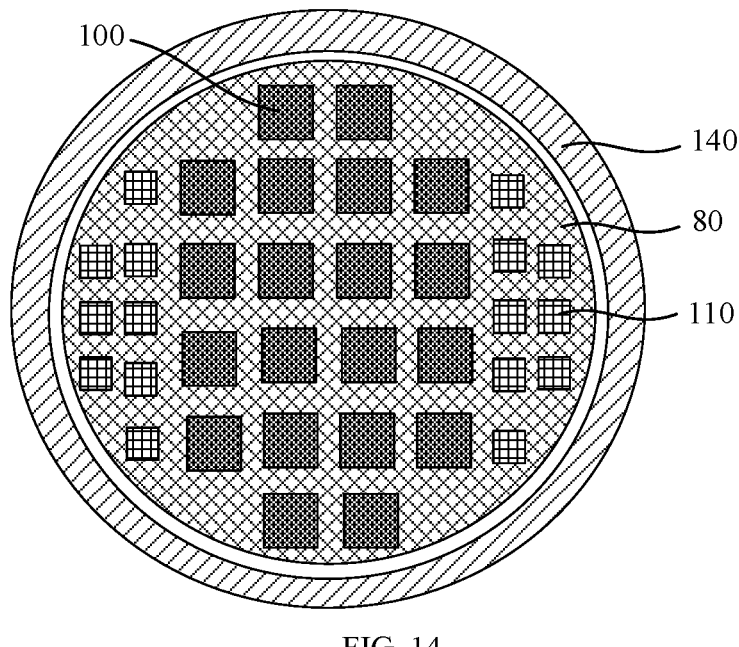
FIG. 14 is a top view showing the first functional chips and components on a wafer according to an embodiment of the present disclosure.

As an example, as shown in FIG. 14, which is a top view of the first function chips 100 and the components 110, there are multiple first function chips 100 and a number of components 110 arranged in an array, and various functional chips including processors, memory, etc. and various components including photoelectric components, optical components, MEMS components, etc. can be integrated on one packaging wafer, thereby achieving a basic complete function.

Figure 15:
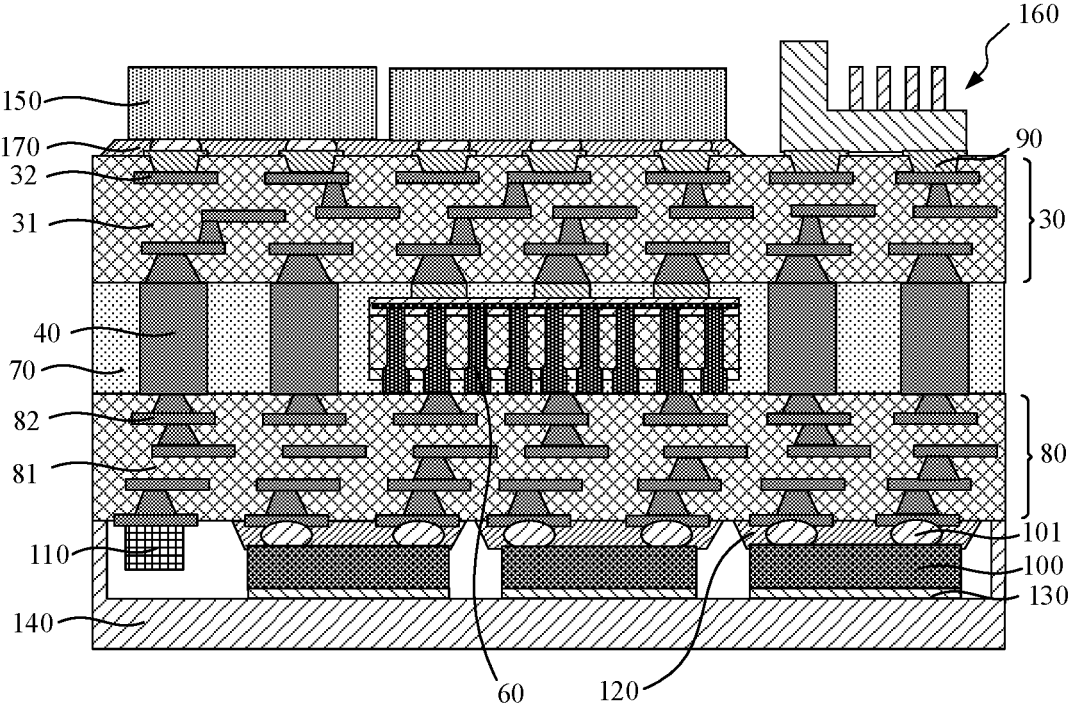
FIG. 15 shows a schematic diagram of an intermediate structure obtained after connecting the second function chips and a connector to the conductive blocks over the side of the first rewiring layer away from the encapsulation layer according to an embodiment of the present disclosure.

Optionally, second function chips 150 and a connector 160 are connected to the conductive blocks 90, respectively, as shown in FIG. 15.

As an example, the second function chips 150 comprise one or more of a processor, a memory, a power management chip, a transmitter chip, a receiver chip, and the like.

As an example, a second filler layer 170 is formed at gaps between the second function chips 150 and the conductive blocks 90; the second filler layer 170 protects connection between the second function chips 150 and the conductive blocks 90 from corrosion or physical damage, and can also improve the bonding strength between the second function chips 150 and the conductive blocks 90, thereby improving the mechanical strength of the entire packaging structure.

As an example, the connector 160 comprises a header connector, used for subsequent connection to the packaging wafer and then to an external power supply.

As an example, when the conductive blocks 90 are connected to the second function chips 150 and the connector 160, the conductive blocks 90 are preferably connected to the second function chips 150 and the connector 160 via conductive inserts.

As an example, by having two chip layers (i.e., a layer of the first function chips 100 and a layer of the second function chips 150), the packaging structure obtains a higher flexibility and a wider compatibility. For example, while maintaining complete functions of the packaging structure by having multiple chips, arranging the chips in two separate layers can increase the spacing between the chips, reduce the crosstalk between the chips, and therefore improve the flexibility and compatibility of the packaging structure.

Embodiment 2

Embodiment 2 discloses a fan-out system-level packaging structure, as shown in FIG. 13. The packaging structure comprises a first rewiring layer 30, a second rewiring layer 80, an encapsulation layer 70, a connecting bridge 60, conductive blocks 90, first function chips 100, components 110, a cooling cover 140, and a packaging wafer; the second rewiring layer 80 is disposed over the first rewiring layer 30 with a predetermined distance; the encapsulation layer 70 is disposed between the first rewiring layer 30 and the second rewiring layer 80; the connecting bridge 60 extends vertically through the encapsulation layer 70, has a bottom end electrically connected to the first rewiring layer 30 and a top end electrically connected to the second rewiring layer 80; the conductive blocks 90 are located on a side of the first rewiring layer 30 facing away from the encapsulation layer 70, and are electrically connected to the first rewiring layer 30; the first function chips 100 are located on a side of the second rewiring layer 80 facing away from the encapsulation layer 70, and are electrically connected to the second rewiring layer 80; the components 110 are located on a side of the second rewiring layer 80 facing away from the encapsulation layer 70, and are electrically connected to the second rewiring layer 80; the first function chips 100 are spaced apart from the components 110 by a predetermined distance; the cooling cover 140 is located on a side of the second rewiring layer 80 facing away from the encapsulation layer 70; a cavity is formed between the cooling cover 140 and the second rewiring layer 80; the first function chips 100 and the components 110 are located in the cavity; the packaging wafer is located on a side of the first rewiring layer 30 where the conductive blocks 90 are disposed, and the packaging wafer is connected to the conductive blocks 90.

As an example, the first rewiring layer 30 comprises at least one first dielectric layer 31 and at least one first metal wiring layer 32 vertically stacked, and the second rewiring layer 80 comprises at least one first dielectric layer 81 and at least one second metal wiring layer 82 vertically stacked.

As an example, the connecting bridge 60 is an inorganic perforated bridge for connecting chips, formed by filling through-silicon-vias (TSV) with conductive metal materials, with a line width/line spacing ranging from 0.2 μm/0.2 μum to 50 μm/50 μm.

Optionally, the connecting bridge 60 is an organic perforated bridge for connecting chips, formed by forming through-holes in an organic layer and filling the through-holes with conductive metal materials, with a line width/line spacing ranging from 22 μm/22 μm to 50 μm/50 μm. Although the minimum line width/line spacing of the organic perforated bridge is larger than that of the inorganic perforated bridge, the former is much cheaper; therefore, in actual production and manufacturing, the type of connecting bridge 60 may be chosen based on factors such as demand and production cost.

The connecting bridge 60 increases the I/O line density and realizes a high-density connection of chips.

As an example, the packaging structure further comprises conductive posts 40 located between the first rewiring layer 30 and the second rewiring layer 80, and extending through the encapsulation layer 70; top ends of the conductive posts 40 are electrically connected to the second rewiring layer 80, and bottom ends of the conductive posts 70 are electrically connected to the first rewiring layer 30; the connecting bridge is more costly, and in order to reduce costs, the connecting bridge 60 is used for connection in areas where the packaging structure requires ultra-high density connection, and the conductive posts 40 are used for connection in other areas.

As an example, the conductive posts 40 are copper posts.

As examples, the encapsulation layer 70 comprises one or more of a polymer-based material layer, a resin-based material layer, a polyamide layer, and an epoxy resin layer.

As an example, there are multiple first functional chips 100, such as processors and memory. Similarly, there may be multiple components 110, including photoelectric components, optical components, and MEMS components. It should be noted that the present disclosure only exemplarily enumerates several types of the first function chips 100 and the components 110, and in the actual production and manufacturing, the types, and numbers of the first function chips 100 and the components 110 may be determined according to the functional requirements of the packaging.

As an example, the packaging structure further comprise chip pads 101, and the first function chips 100 are connected to the second metal wiring layer 82 via the chip pads 101.

As an example, a first filler layer 120 is formed at gaps between the first function chips 100 and the second rewiring layer 80; the first filler layer 120 protects the connection between the first function chips 100 and the second rewiring layer 80 from corrosion or physical damage, and also improves the bonding strength between the first function chips 100 and the second rewiring layer 80, thereby improving mechanical strength of the package.

As an example, a heat-transfer-medium layer 130 is formed between surfaces of the first function chips 100 and the cooling cover 140; the heat-transfer-medium layer 130 may be made of thermal paste or other suitable materials with a high thermal conductivity; the heat-transfer-medium layer 130 not only acts as a binder between the first function chips 100 and the cooling cover 140, but also dissipates heat generated by the first function chips 100.

As an example, the packaging wafer is an 8-inch or 12-inch wafer; the conductive blocks 90 are connected to the packaging wafer for subsequent electrical lead-out of the packing structure, such as connecting to an external power supply, etc.

As an example, the conductive blocks 90 comprise solder balls or conductive inserts.

As an example, as shown in FIG. 14, which is a top view of the first function chips 100 and the components 110, there are a plurality of first function chips 100 and a plurality of components 110 arranged in an array, and various functional chips including processors, memory, etc. and various components including photoelectric components, optical components, MEMS components, etc. can be integrated on one packaging wafer, thereby achieving a basic complete function.

Optionally, second function chips 150 and a connector 160 are connected to the conductive blocks 90, respectively, as shown in FIG. 15. As an example, the second function chips 150 comprise one or more of a processor, a memory, a power management chip, a transmitter chip, a receiver chip, and the like. As an example, the connector 160 comprises a header connector, used for subsequent connection to the packaging wafer and then to an external power supply.

As an example, a second filler layer 170 is formed at gaps between the second function chips 150 and the conductive blocks 90; the second filler layer 170 protects connection between the second function chips 150 and the conductive blocks 90 from corrosion or physical damage, and can also improve the bonding strength between the second function chips 150 and the conductive blocks 90, thereby improving the mechanical strength of the entire packaging structure.

As an example, by having two chip layers (i.e., a layer of the first function chips 100 and a layer of the second function chips 150), the packaging structure obtains a higher flexibility and a wider compatibility. For example, while maintaining complete functions of the packaging structure by having multiple chips, arranging the chips in two separate layers can increase the spacing between the chips, reduce the crosstalk between the chips, and therefore improve the flexibility and compatibility of the packaging structure.

In summary, in the fan-out system-level packaging structure and method of the present disclosure, the connecting bridge is introduced to achieve interconnection between upper and lower layers, increasing the density of I/O lines. High-density connection packaging is achieved by connecting the first functional chips and the components on the second rewiring layer. This allows for the integration of functional chips such as processors and memory, as well as optoelectronic components, optical components, and/or MEMS components into a single package on a packaging wafer (e.g., 8-inch or 12-inch) to achieve a complete system. This improves the integration of the process/structure. Additionally, by connecting the second functional chips and the connector through the conductive blocks, greater flexibility, and wider compatibility as well as high-density connections can be obtained, which enhances the overall performance of the package. Therefore, the present disclosure effectively overcomes various shortcomings in the existing technology and has high industrial utilization value.

The above-mentioned embodiments are for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method of fabricating a fan-out system-level package, comprising steps of:

step 1: forming a first rewiring layer over a supporting substrate;

step 2: forming a connecting bridge, wherein a bottom surface of the connecting bridge is configured to electrically connect to the first rewiring layer;

step 3: forming an encapsulation layer over the first rewiring layer, wherein the encapsulation layer covers a top surface of the connecting bridge, and thinning the encapsulation layer until the top surface of the connecting bridge is exposed;

step 4: forming a second rewiring layer over the encapsulation layer, wherein the second rewiring layer is configured to electrically connect to the connecting bridge;

step 5: removing the supporting substrate, and disposing conductive blocks on a side of the first rewiring layer facing away from the encapsulation layer, wherein the conductive blocks are electrically connected to the first rewiring layer;

step 6: electrically connecting first function chips and components to a side of the second rewiring layer facing away from the encapsulation layer, respectively;

step 7: forming a cooling cover over the second rewiring layer, wherein a cavity is configured to be between the cooling cover and the second rewiring layer, wherein the first function chips and the components are disposed in the cavity; and step 8: connecting the conductive blocks to a packaging wafer.

2. The method according to claim 1, further comprising, before step 3:

forming conductive posts at predetermined locations on the first rewiring layer, wherein the conductive posts are electrically connected to the first rewiring layer, wherein the conductive posts are spaced apart from the connecting bridge, wherein the conductive posts are embedded in the encapsulation layer first, and top surfaces of the conductive posts are exposes from the thinned encapsulation layer after step 3, also, and wherein the conductive posts are also electrically connected to the second rewiring layer.

3. The method according to claim 1, further comprising forming the connecting bridge by first drilling through-holes in an inorganic layer and filling the through-holes with a conductive metal material, wherein the connecting bridge comprises an inorganic perforated structure, and wherein the inorganic layer comprises a silicon substrate.

4. The method according to claim 1, wherein the connecting bridge comprises an organic perforated structure, formed by drilling through-holes in an organic layer and filling the through-holes with a conductive metal material.

5. The method according to claim 1, wherein the conductive blocks comprise solder balls or conductive inserts.

6. The method according to claim 1, further comprising:

after step 6 and before step 8, connecting second function chips to the conductive blocks; and after step 8, connecting the packaging wafer and the conductive blocks with a connector, wherein the second function chips are spaced apart from the connector.

* * * * *